(12) United States Patent
Fukamachi et al.

(10) Patent No.: US 7,463,663 B2
(45) Date of Patent: Dec. 9, 2008

(54) SEMICONDUCTOR LASER DIODE AND INTEGRATED SEMICONDUCTOR OPTICAL WAVEGUIDE DEVICE

(75) Inventors: Toshihiko Fukamachi, Kokubunji (JP); Shigeki Makino, Kokubunji (JP); Takafumi Taniguchi, Tokyo (JP); Masahiro Aoki, Kokubunji (JP)

(73) Assignee: Opnext Japan, Inc., Kanagawa (JP)

( * ) Notice: Subject to any disclaimer, the term of this patent is extended or adjusted under 35 U.S.C. 154(b) by 0 days.

(21) Appl. No.: 11/703,159

(22) Filed: Feb. 7, 2007

(65) Prior Publication Data

US 2007/0195847 A1    Aug. 23, 2007

(30) Foreign Application Priority Data

Feb. 22, 2006    (JP) ............... 2006-044887

(51) Int. Cl.
   *H01S 5/00*    (2006.01)
(52) U.S. Cl. ............... 372/46.01; 372/43.01; 372/54
(58) Field of Classification Search ............ 372/46.01, 372/43.01
   See application file for complete search history.

(56) References Cited

U.S. PATENT DOCUMENTS

| | | | | |
|---|---|---|---|---|
| 6,018,539 A | * | 1/2000 | Kimura et al. | ............ 372/45.01 |
| 7,295,588 B2 | * | 11/2007 | Tanaka et al. | ............ 372/46.01 |

FOREIGN PATENT DOCUMENTS

| | | |
|---|---|---|
| JP | 2002-134826 | 2/1992 |
| JP | 08-078792 | 8/1995 |
| JP | 2000-066046 | 8/1998 |
| JP | 2004-214372 | 12/2002 |
| JP | 2004-226769 | 1/2003 |
| JP | 2004-287116 | 3/2003 |
| JP | 2004-311556 | 4/2003 |

OTHER PUBLICATIONS

Makino, Shigeki, et al., "Wide Temperature Range (0 to 85° C), 40-km SMF Transmission of a 1.55-μm, 10-Gbits/s InGaAIAs Electroabsorption Modulator Integrated DFB Laser", Optical Society of America, 205, 3 pages, no date provided.

* cited by examiner

*Primary Examiner*—Dung T Nguyen
(74) *Attorney, Agent, or Firm*—Reed Smith LLP; Stanley P. Fisher, Esq.; Juan Carlos A. Marquez, Esq.

(57) ABSTRACT

A conventional semiconductor laser diode is small in optical power at a constant operating current and limited in ridge width when integrated with an optical device, which forces the integration to be performed by lowering the original characteristic and makes it difficult to reduce cost and power consumption. In a semiconductor laser diode, widening of the ridge width is made possible by lowering the difference in refractive indexes between the ridge and other components, diffusion current and increase in the difference of refractive indexes are prevented by forming approximately vertical grooves along both sides of the ridge, and deterioration in characteristics due to regrowth is prevented by forming a diffraction grating on the ridge. The semiconductor laser diode is integrated with an optical device such as electroabsorption type optical modulator without increase of growth cycles and without restriction of the ridge width by using a tapered waveguide.

5 Claims, 12 Drawing Sheets

SEMICONDUCTOR LASER DIODE AND INTEGRATED SEMICONDUCTOR OPTICAL WAVEGUIDE DEVICE

The present application claims priority from Japanese application JP 2006-044887 filed on Feb. 22, 2006, the content of which is hereby incorporated by reference into this application.

FIELD OF THE INVENTION

The present invention relates to a semiconductor laser diode and an integrated optical waveguide device in which the semiconductor laser diode and an optical modulator are integrated.

BACKGROUND OF THE INVENTION

Recently, it is becoming increasingly important to reduce power consumption and cost of a semiconductor laser diode and an integrated semiconductor optical waveguide device in which a semiconductor laser diode and an electroabsorption type optical modulator are integrated. For the semiconductor laser diode, there are mainly ridge type and buried heterostructure type, of which the ridge type is advantageous for cost reduction because of its easier fabrication and smaller number of growth steps and is actively developed for use in both information and communication. The ridge type semiconductor laser diode is formed by laminating a lower clad layer, multiple or single well layer, upper clad layer, and ridge on a substrate formed of n-type semiconductor. An integrated semiconductor optical waveguide device (EA/DFB) is constructed by integrating this ridge type semiconductor laser diode and an electroabsorption type optical modulator with ridge on a common substrate.

In the field of information, high speed recording of information is demanded in accordance with an increase in the amount of information to be recorded, resulting in an increasing need for a higher power semiconductor laser diode. Although this may be met by increasing an operating current, it is disadvantageous for reduction in power consumption. On the other hand, in the field of communication, the mainstream transmission speed in current backbone network and metro network is 2.5 Gbps or 10 Gbps. Therefore, a structure of integrated semiconductor optical waveguide device in which an optical modulator is monolithically integrated for high speed modulation of a transmitter is advantageous for reduction in cost. However, power consumption increases with an increase in transmission distance as well as with the use of higher bit rate. With the aim of reducing the power consumption, the development of an electroabsorption modulator integrated distributed feedback laser (EA/DFB) that does not require temperature control between −5 degree C. and 85 degree C. has been pursued (Non-patent document 1: OFC-NFOEC OFC POSTDEADLINE PAPERS Thursday, Mar. 10, 2005 PDP14). In order to achieve this, further enhancement in optical power of a semiconductor laser diode under a constant operating current is needed. Thus, the enhancement in optical power under a constant operating current is required for the reduction in power consumption of a semiconductor laser diode for use in both information and communication.

One method of power enhancement of a semiconductor laser diode is to widen its ridge width. Since the amount of heat generated becomes larger in general as the operating current in a semiconductor laser diode is raised, optical power is saturated at a certain current level, thereby making it impossible to obtain enough output. On the other hand, an electric resistance at the time of current injection into a semiconductor laser diode whose ridge width is widened is lowered, the amount of heat generation is correspondingly suppressed, and the saturation current is enhanced. As the result, the saturation output is also enhanced, and the optical power at a constant operating current is increased. The widening of the ridge width can be realized by forming an upper buffer layer between an upper clad layer and the ridge. An average refractive index difference in the lamination direction between the portion including the ridge and the portion not including the ridge becomes smaller by forming the upper buffer layer compared to when the upper buffer layer is not provided, and so-called cut-off width referred in the slab waveguide is increased, which makes it possible to widen the ridge width in lateral single mode.

As another method of the power enhancement, there is a method to suppress a rise of threshold current of a semiconductor laser diode. When the threshold current is low, optical power at a constant operating current rises, and thus the power enhancement of a semiconductor laser diode can be realized. As the method to suppress the rise of the threshold current, for example, there is a method disclosed in JP-A No. 214372/2004 (Patent document 1). In this method, a cover layer injected with Fe is formed by regrowth in both side directions of the ridge of a conventional ridge type semiconductor laser diode formed of InP series such as InP, InGaAsP and InGaAlAs, and this is used as an Fe supply source to an upper clad layer. The upper clad layer is made insulative, thereby suppressing diffusion of current injected from the ridge in the upper clad layer and a rise of the threshold current. When these lasers are made to function as a distributed feedback (DFB) type, a diffraction grating has been conventionally fabricated in an upper portion of n-substrate, a multiple well layer, or an upper buffer layer.

On the other hand, as for EA/DFB, for example, a semiconductor optical waveguide device in which a buried heterostructure type semiconductor laser diode and a ridge type electroabsorption type optical modulator are integrated differs in mode expansion in each portion, and therefore, a method of integrating the buried heterostructure type and the ridge type by tapering each joint portion is proposed in JP-A No. 78792/1996 (Patent document 2). Further, a method in which the light emitting side of a semiconductor optical waveguide device is tapered to make light coupling to fiber better is proposed in JP-A No. 66046/2000 (Patent document 3). However, no semiconductor optical waveguide device integrated with a high power laser in which ridge is widened or threshold current is lowered as described above has been disclosed.

As described above, the insertion of the upper buffer layer between the upper clad layer and the ridge is effective for power enhancement of a semiconductor laser diode, whereas there has been a problem that lateral diffusion of carrier becomes larger particularly on the p-side and the threshold current is increased. Further, since the average refractive index difference between the portion including the ridge and the portion not including the ridge becomes smaller, mode shape laterally expands, and far field pattern expansion becomes markedly different between in the horizontal direction and in the vertical direction, resulting in being asymmetrical. This causes an increase in loss of coupling to an exterior such as fiber.

To suppress the above-described rise of the threshold current, the application of the method disclosed in Patent document 1 is conceivable. However, this method requires crystal regrowth to form a cover layer. Therefore, it is disadvantageous in terms of cost reduction, and further, the application of the method is limited to InP-substrate based laser diodes, making it impossible to apply to semiconductor laser diodes formed of other materials such as GaAs-substrate based laser diodes.

For a high power semiconductor laser diode, it is effective to insert the upper buffer layer between the upper clad layer and the ridge to widen the ridge width. The application of this method to an integrated semiconductor waveguide device such as EA/DFB created another problem. For example, for power enhancement of a semiconductor laser diode, when the ridge width of a semiconductor laser diode is set to 2 µm, the capacitance increases and the band decreases in an electroabsorption type optical modulator portion. On the other hand, when the ridge width of the semiconductor laser diode is set to 1.4 µm in accord with the ridge width of 1.4 µm of the electroabsorption type optical modulator portion, the thermal characteristic of the semiconductor laser diode deteriorates and high output cannot be obtained. Therefore, as a trade-off value, the ridge width of EA/DFB has been set to ca.1.6 µm for integration which deviates from an original optimal ridge width and at which an overall characteristic deteriorates but each of the semiconductor laser diode and the electroabsorption type optical modulator can fulfill its function with ease.

Further, the insertion position of a diffraction grating also affects laser characteristics. A conventional position for fabrication of a diffraction grating has been in an upper portion of n-substrate, a multiple well layer, or an upper buffer layer. When the diffraction grating is inserted into the multiple well layer or the upper buffer layer, regrowth is carried out after forming the diffraction grating. However, a change in carrier concentration occurs at the regrowth interface, resulting in trapping of carrier, which causes deterioration of a characteristic in respect of power enhancement. On the other hand, when the diffraction grating is fabricated in the upper portion of n-substrate, the above problem can be ignored but wavelength controllability deteriorates because the diffraction grating has been formed before a multiple well layer is formed.

As described above, the above methods have not yet reached a point where reduction in power consumption and reduction in cost are compatible with each other. In addition, the design of a semiconductor laser diode and an electroabsorption type optical modulator, particularly ridge width thereof, is subject to limitation for integration, and each device has not been able to be integrated under optimal conditions.

SUMMARY OF THE INVENTION

The present invention accomplishes a high power semiconductor laser diode. Further, the present invention achieves reduction in power consumption of an integrated semiconductor optical waveguide device in which the semiconductor laser diode enhanced in output power is integrated with an electroabsorption type optical modulator as well as reduction in cost of the integration without deteriorating each characteristic of the semiconductor laser diode and the electroabsorption type optical modulator.

First, the semiconductor laser diode is formed from a lower clad layer, a multiple or single well layer, an upper clad layer, an upper buffer layer, and a ridge on an n-type semiconductor substrate. Further, insulative grooves with a low refractive index that are cut into the upper buffer layer along both sides of the ridge are formed, thereby suppressing lateral diffusion of current injected from the ridge. Owing to this, a rise of threshold current is suppressed.

In the semiconductor laser diode constructed from the lower clad layer, the multiple or single well layer, the upper clad layer, the ridge, and the like on the n-type semiconductor substrate, a diffraction grating is formed, in the ridge, of a semiconductor material having a refractive index higher than that of a semiconductor material mainly constituting the ridge. In this way, the ridge is manufactured without characteristic deterioration caused by contamination of impurities and a change in carrier concentration due to regrowth after forming the diffraction grating, compared to when the diffraction grating is formed on the upper clad layer.

On the other hand, in an integrated semiconductor optical waveguide device such as EA/DFB, the respective ridges of the semiconductor laser diode and an electroabsorption type optical modulator provided with a ridge are connected by a waveguide having a ridge in a tapered form.

According to the present invention, a semiconductor laser diode having a high output power and a low threshold current can be realized. At the same time, in an integrated semiconductor optical waveguide device such as EA/DFB, the semiconductor laser diode and the electroabsorption type optical modulator can not only be made to exhibit their respective characteristics maximally but also be integrated at low cost while suppressing anisotropy in the expansion of the far field pattern of emitting light in the vertical direction and the horizontal direction with low loss of light and without increasing the growth cycle at the time of integration.

BRIEF DESCRIPTION OF THE DRAWINGS

FIG. 1 is a diagram to explain the first half of a fabrication process of a semiconductor laser diode having an upper buffer layer as the premise of the present invention, where

FIG. 2 is a diagram to explain the second half of the fabrication process of the semiconductor laser diode having the upper buffer layer as the premise of the present invention, where FIG. 2C represents a completed state of the semiconductor laser diode;

FIG. 4 is a diagram to explain the first half of a fabrication process of a semiconductor laser diode of Embodiment 1 of the present invention using the structure in FIG. 2A as a starting point, where

FIG. 5 is a diagram to explain the second half of the fabrication process of the semiconductor laser diode of Embodiment 1 of the present invention, where

FIG. 8C represents a completed state of the semiconductor laser diode;

FIG. 9 is a diagram showing the first half of a fabrication process of an integrated optical waveguide device of Embodiment 3 of the present invention, where

FIG. 10 is a diagram showing the second half of the fabrication process of the integrated optical waveguide device of Embodiment 3 of the present invention, where

DETAILED DESCRIPTION OF THE PREFERRED EMBODIMENTS

Hereinafter, preferred embodiments of the present invention are explained with Embodiments 1 to 5 with reference to related drawings.

Embodiment 1

Embodiment 1 in which the present invention was applied to a 1.5 µm-wavelength band ridge waveguide type semiconductor laser diode is explained first. It should be noted that the figure size and the scale described in Embodiment 1 do not necessarily correspond proportionately. A semiconductor laser diode having an upper buffer layer as the premise of the present invention is explained using FIGS. 1 and 2, and then an embodiment of a semiconductor laser diode of the present invention in which insulative grooves with a low refractive index that were cut into the upper buffer layer along both sides of the ridge were formed is explained.

Figure 1A:
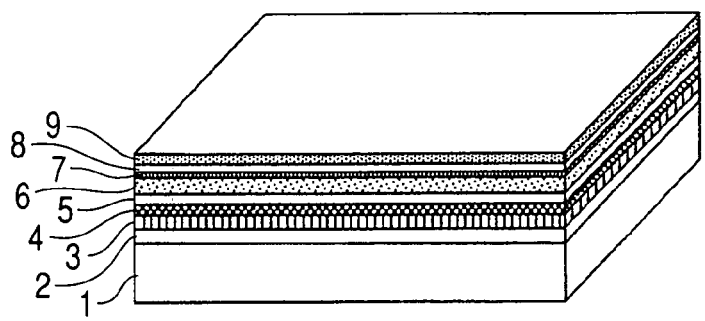
FIG. 1A, FIG. 1B, FIG. 1C, and FIG. 1D show successive steps of the process.

As shown in FIG. 1A, on an n-type InP semiconductor substrate 1 (thickness 2 mm), an n-type InP buffer layer 2 (thickness 0.15 µm), a lower clad layer 3 (thickness 0.13 µm) formed of n-type InGaAsP series, a multiple-quantum well active layer 4 (thickness 0.114 µm) in which a well layer formed of InGaAsP (thickness 7 nm, compositional wavelength 1.3 µm) having 1.0% compressive strain and a barrier layer formed of InGaAsP (thickness 12 nm, compositional wavelength 1.3 µm) having 0.5% tensile strain were laminated by 6 cycles, an upper clad layer 5 (thickness 0.1 µm) formed of InGaAsP series, an upper buffer layer 6 (thickness 0.2 µm) formed of p-type InP, an etching stop layer 7 (thickness 5 nm) formed of InGaAsP series, a lower spacer layer 8 (thickness 20 nm) formed of InP, and a diffraction grating layer 9 (thickness 30 nm) formed of InGaAsP series were laminated by metal organic chemical vapor deposition (MOCVD). In this embodiment, the emission wavelength of the multiple-quantum well active layer was about 1.5 µm.

Figure 1B:
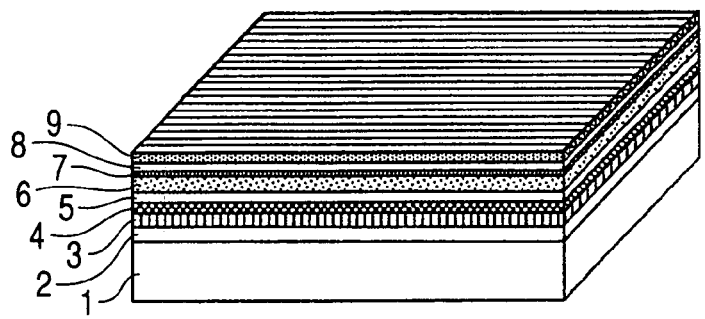

Next, as shown in FIG. 1B, a diffraction grating was formed on the diffraction grating layer 9 by a known interference exposure method and subsequent etching using a phosphoric acid based solution. Since in Embodiment 1, the InP spacer layer 8 was provided between the etching stop layer 7 and the diffraction grating layer 9, the diffraction grating became a floating type and could be fabricated with high precision even if etching time varied somewhat in every fabrication.

Figure 1C:
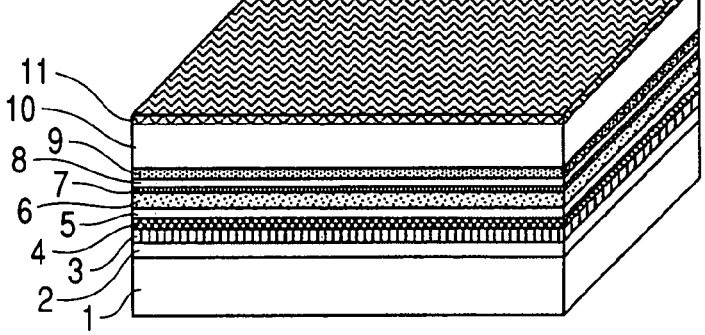

Subsequently, as shown in FIG. 1C, a p-type InP layer 10 (thickness 2.0 µm) and a contact layer 11 (thickness 0.3 µm) comprising InGaAsP (compositional wavelength 1.3 µm) and InGaAs were laminated, by MOCVD, on the diffraction grating layer 9 with the diffraction grating formed.

Figure 1D:
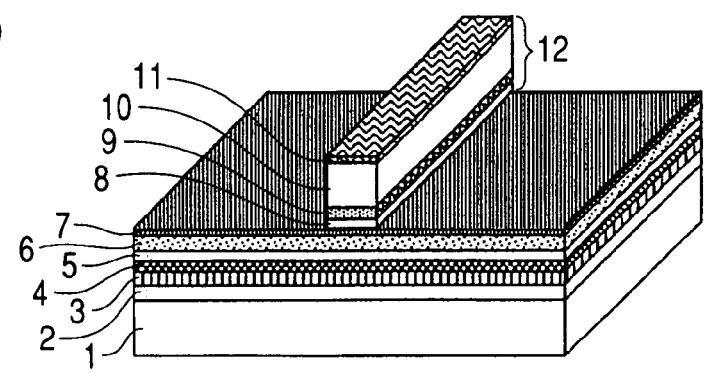

Then, as shown in FIG. 1D, formation of a ridge 12 that comprises the lower spacer layer 8, the diffraction grating layer 9, the p-type InP layer 10, and the contact layer 11 was carried out by etching up to the etching stop layer 7 leaving a ridge (width 2.8 µm).

Figure 2A:
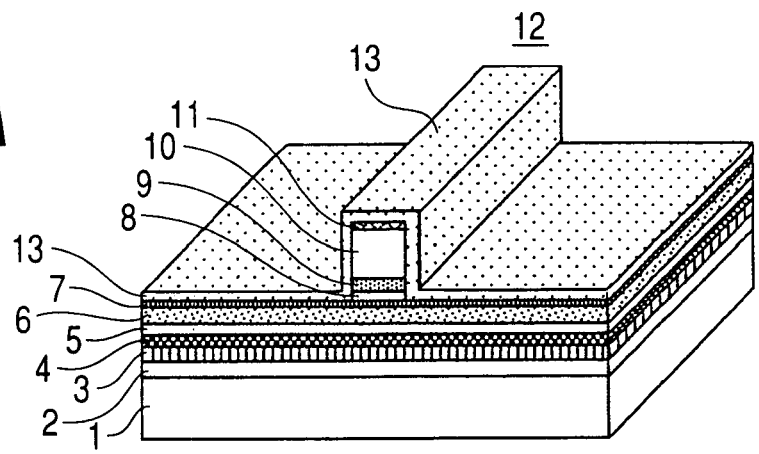
FIG. 2A, FIG. 2B, and FIG. 2C show successive steps of the process.
Figure 2B:
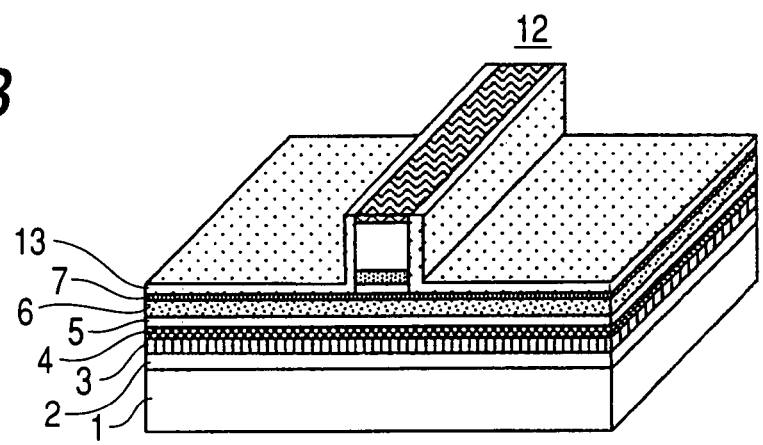
Figure 2C:
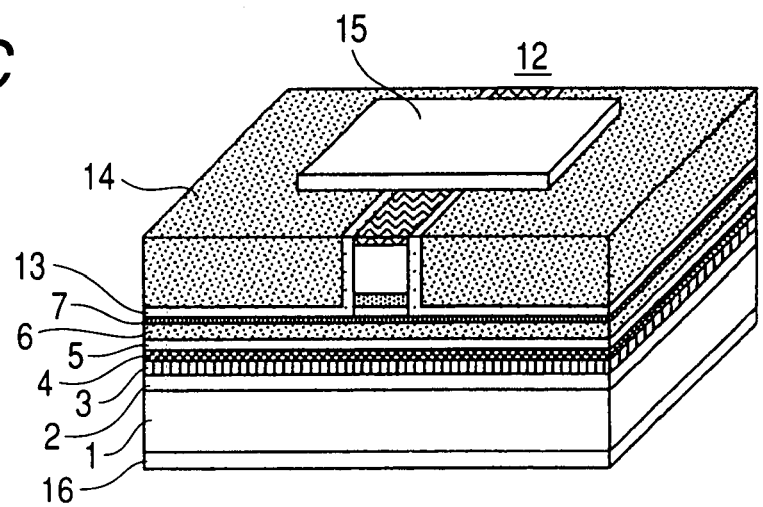

Subsequently, as shown in FIG. 2A, a silicon oxide film 13 (thickness 0.1 µm) was formed on the entire surface upper than the etching stop layer 7 by thermo-chemical vapor deposition (T-CVD). Then, as shown in FIG. 2B, the insulating film (silicon oxide film 13) on the contact layer 11 in the upper portion of the ridge 12 was removed. Although the silicon oxide film 13 was employed as the insulating film in Embodiment 1, it is also possible to use a silicon nitride film and the like. As shown in FIG. 2C, a polyimide resin layer 14 was provided on the insulating film 13 on both sides of the ridge 12, and the wafer surface was flattened. After a p-electrode 15 and an n-electrode 16 were formed on the upper portion of the ridge 12 and on the backside of the n-type InP substrate 1, respectively, a device having a cavity length of 300 µm was cut out by a cleavage step, and a reflection film having 95% reflectance and a low reflection film having 0.1% reflectance were coated on the rear end face and the front end face thereof, respectively.

When the semiconductor laser diode shown in FIG. 2C was operated in the operating current range of up to 300 mA at from −5 degree C. to 85 degree C., a lateral single mode was confirmed. In addition, excellent lasing characteristics with a threshold current of 15 to 25 mA and lasing efficiency of 0.3 to 0.4 W/A were shown under the conditions of room temperature and continuous lasing. Further, a threshold current of ca. 35 mA and a lasing efficiency of 0.15 to 0.2 W/A were obtained at an operating temperature of 85 degree C.

Figure 3:
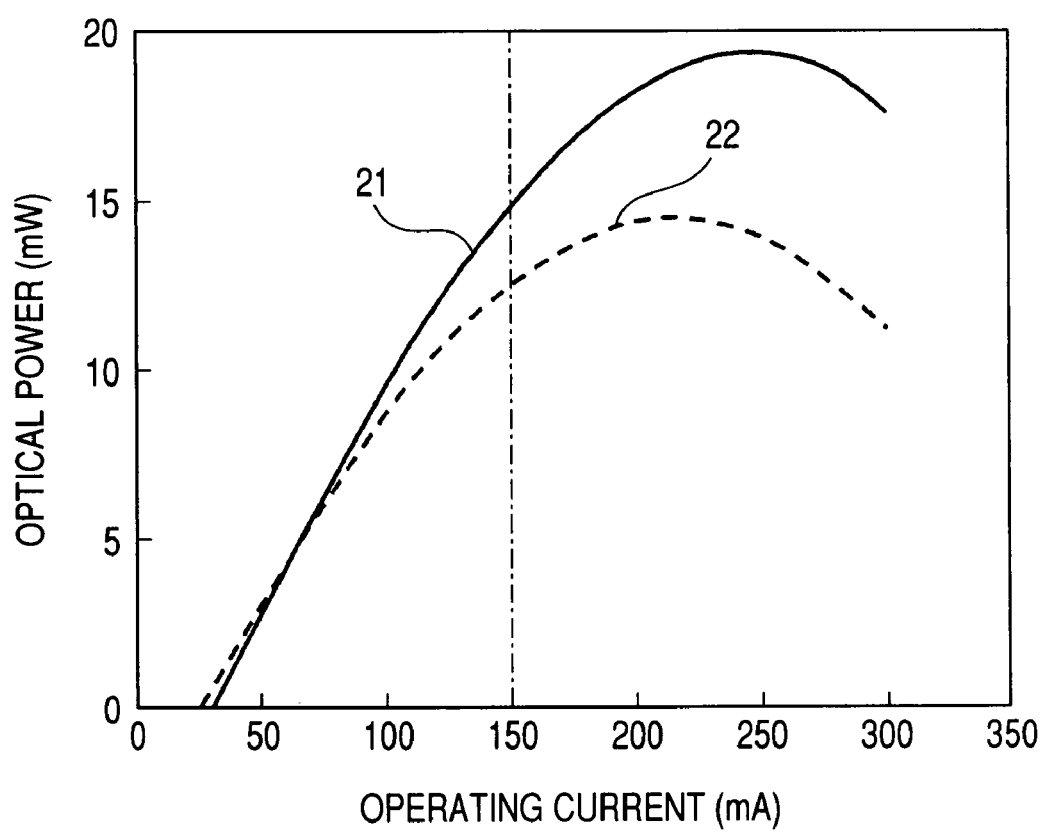
FIG. 3 is a graph showing a comparison result of operation characteristic of a semiconductor laser diode without the upper buffer layer constructed in almost the same structure as that of the semiconductor laser diode as the premise of the present invention.

FIG. 3 is a graph showing a comparison result of the operation characteristic of a semiconductor laser diode constructed in almost the same structure as that shown in FIG. 2C except that the upper buffer layer 6 was not provided. In FIG. 3, the horizontal axis represents operating current, and the vertical axis represents optical power. The solid line 21 shows a characteristic of the semiconductor laser diode provided with the upper buffer layer 6 at an operating temperature of 85 degree C., and the broken line 22 shows a characteristic of the semiconductor laser diode not provided with the upper buffer layer 6 at the same temperature, respectively. When compared at the operating current of 150 mA, the optical power of the semiconductor laser diode provided with the upper buffer layer 6 increased by approximately 20% compared to that of the semiconductor laser diode not provided with the upper buffer layer 6. At this time, the threshold current was 5 to 10 mA higher in the semiconductor laser diode provided with the upper buffer layer 6.

In the above structure, although the lasing wavelength of laser, i.e. the emission wavelength in the multiple-quantum well layer was set to 1.5 μm, a similar effect could also be obtained when the emission wavelength was set to 1.3 μm band. Further, a similar effect was also obtained with a distributed Bragg reflection type and a Fabry-Perot type in place of a distributed feedback type. Furthermore, a laser diode having a similar characteristic could also be obtained even if InGaAlAs series was used instead of InGaAsP series. Still further, the upper buffer layer 6 might be formed of InGaAsP series and InGaAlAs series in place of InP.

Although it was understood that widening of the ridge width by inserting the upper buffer layer 6 between the upper clad layer 5 and the ridge 12 is effective for power enhancement of a semiconductor laser diode, there is a problem that the threshold current increases as described in BACKGROUND OF THE INVENTION and in the explanation with reference to FIG. 3. To solve this problem, in Embodiment 1 of the present invention, grooves cut into the upper buffer layer 6 along both side faces of the ridge 12 were provided to suppress diffusion of current flowing into the multiple-quantum well active layer 4, thereby preventing the increase in the threshold current.

Figure 4A:
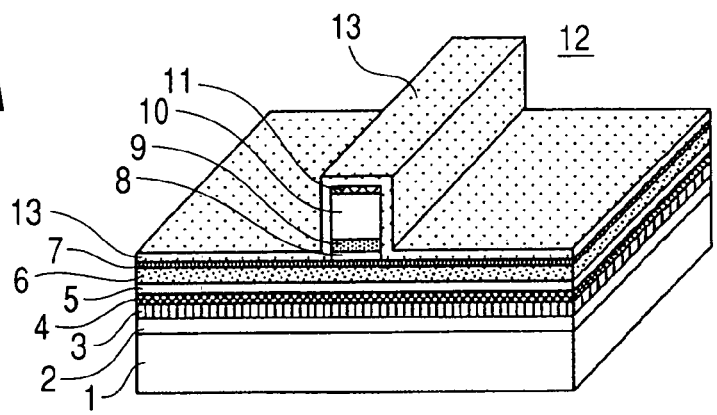
FIG. 4A, FIG. 4B, FIG. 4C, and FIG. 4D show successive steps of the process.

FIG. 4A is a diagram showing a structure in the fabrication process in which the silicon oxide film 13 was formed on the entire surface upper than the etching stop layer 7 and which is the same as in FIG. 2A and represents the starting point for constructing the semiconductor laser diode of Embodiment 1.

Figure 4B:
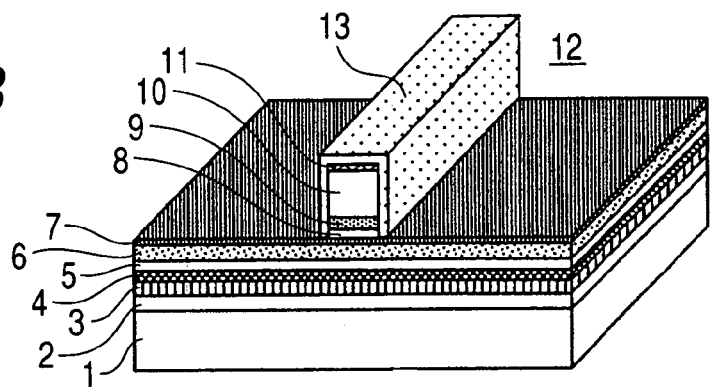

After forming the silicon oxide film 13, the silicon oxide film 13 was removed in a dry etching step. At this time, when the silicon oxide film 13 was made thicker at the portion of the contact layer in the upper portion of the ridge 12, the silicon oxide film 13 was left on the ridge 12 as shown in FIG. 4B, producing a configuration that the ridge 12 covered with the silicon oxide film 13 is on the upper face of the etching stop layer 7.

Figure 4C:
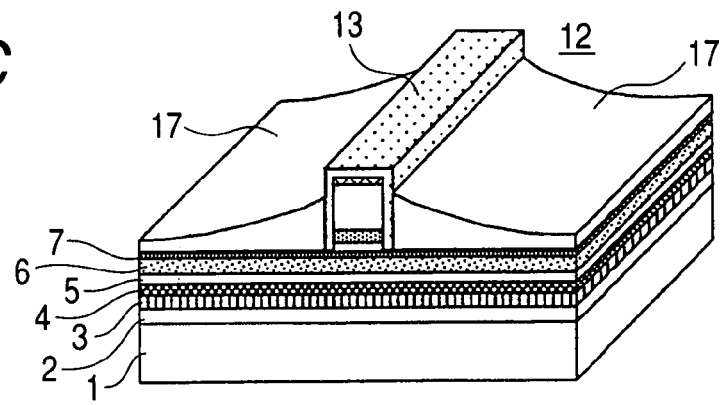

FIG. 4C shows a state that a photoresist 17 was formed on the upper face of the etching stop layer 7 avoiding the ridge 12.

Figure 4D:
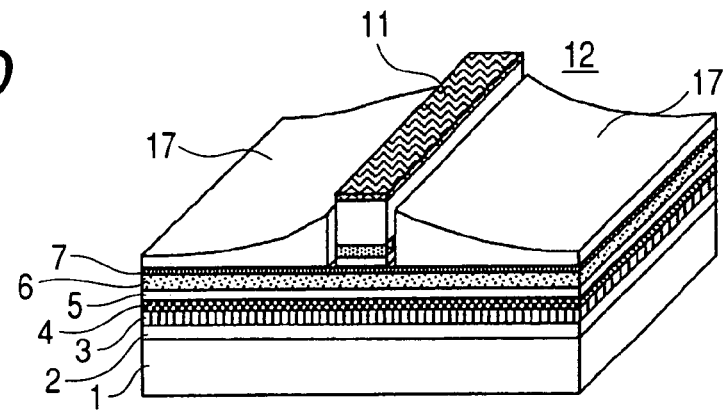

FIG. 4D shows a state that the silicon oxide film 13 was subsequently removed in a photo lithography step while leaving the photoresist 17. As is apparent from the figure, this state represents a state in which the ridge 12 was on the etching stop layer 7 and only the photoresist 17 surrounding the ridge 12 was removed in a groove shape.

Figure 5A:
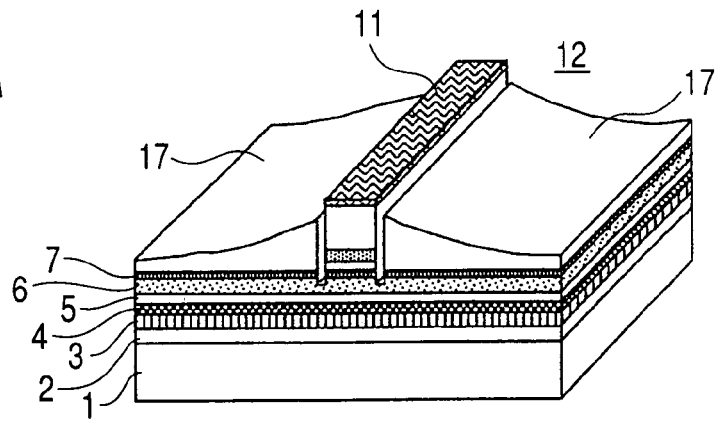
FIG. 5A, FIG. 5B, FIG. 5C, and FIG. 5D show successive steps of the process.

FIG. 5A shows a state that the etching stop layer 7 was first removed in a groove shape by a phosphoric acid based solution using the photoresist 17 removed in the groove shape as a mask from the state shown in FIG. 4D, followed by etching the upper buffer layer 6 in the groove shape with a hydrochloric acid based solution. At this time, the depth of the groove can be adjusted by controlling the etching time. In Embodiment 1, a groove having a depth of 0.1 μm was formed with respect to the film thickness of 0.2 μm of the upper buffer layer 6. Further, since the film thickness of the silicon oxide film 13 was set to 0.1 μm, the width of the groove formed on the buffer layer 6 also became 0.1 μm. The groove could be formed approximately perpendicularly. More specifically, a groove having a width from more than 0 to 200 nm and an angle of 90 degrees ±10 degrees from the substrate surface.

In the embodiment illustrated, the groove was formed up to one half of the thickness of the upper buffer layer 6, but the groove may be formed through the entire thickness of the upper buffer layer 6. In this case, there is an effect that a rise in threshold current by providing the upper buffer layer 6 can be prevented, whereas there is a possibility of affecting a pattern of light emitted from the semiconductor laser diode. Accordingly, how deep the groove is made should be considered depending on each case.

Figure 5B:
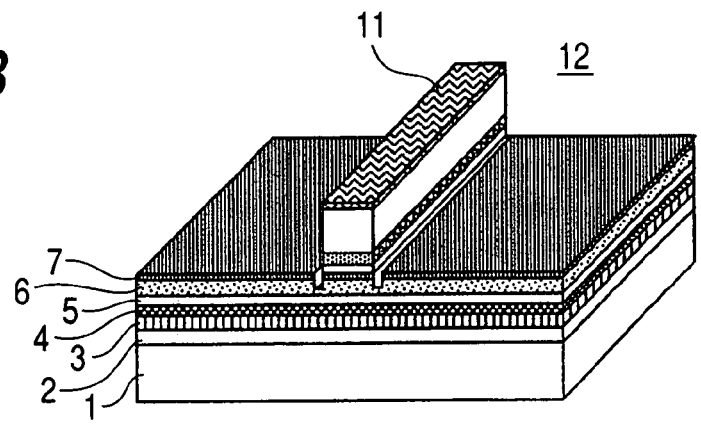

FIG. 5B shows a state that the photoresist 17 was removed. As is apparent from comparison with FIG. 1D, this state is the same as that in FIG. 1D except that grooves are formed in the etching stop layer 7 and the upper buffer layer 6 along the ridge 12.

Figure 5C:
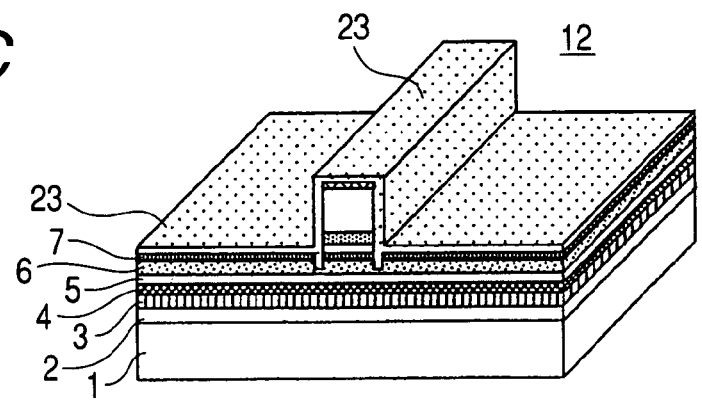

FIG. 5C shows a state that a silicon oxide film 23 (thickness 0.1 μm) was formed on the entire surface upper than the etching stop layer 7 by T-CVD as explained in FIG. 2A. At first glance, this state appears to be the same as the silicon oxide film 13 in FIG. 4A. However, the silicon oxide film 13 in FIG. 4A was provided to form grooves along the ridge 12 and removed after finishing its use, whereas the silicon oxide film 23 was provided to form an insulating layer including the formed grooves.

Figure 5D:
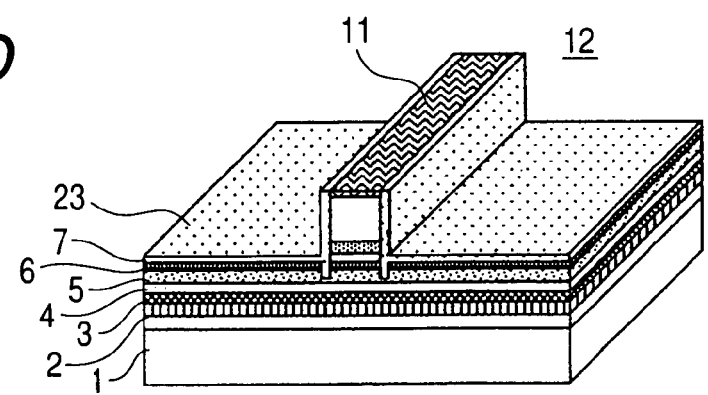

In FIG. 5D, the insulating film (silicon oxide film 23) on the contact layer 11 in the upper portion of the ridge 12 was removed as explained in FIG. 2B. Although the silicon oxide film 23 was employed here as the insulating film in Embodiment 1, it is also possible to use a silicon nitride film and the like.

Figure 6:
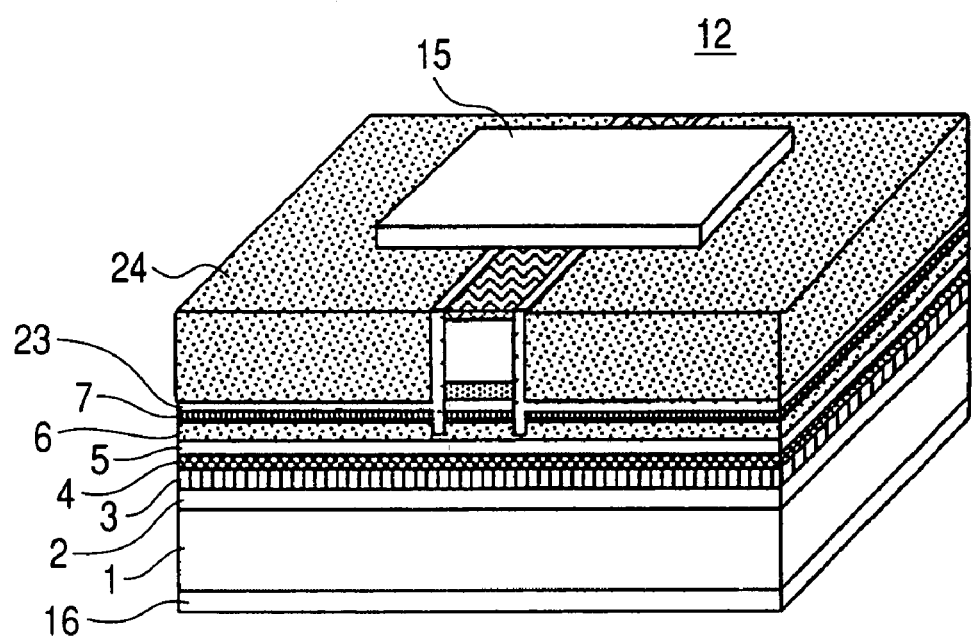
FIG. 6 is a diagram representing a completed state of the semiconductor laser diode of Embodiment 1 of the present invention.

FIG. 6 shows a state that a polyimide resin layer 24 was formed on the upper face of the silicon oxide film 23 to flatten the wafer surface, the p-electrode 15 was formed on the upper portion of the ridge 12, and the n-electrode 16 was formed on the backside of the n-type InP substrate 1.

Then, the device was cut out by a cleavage step, and the reflection film having 95% reflectance and the low reflection film having 0.1% reflectance were coated on the rear end face and the front end face thereof, respectively, to complete a semiconductor laser diode.

Figure 7A:
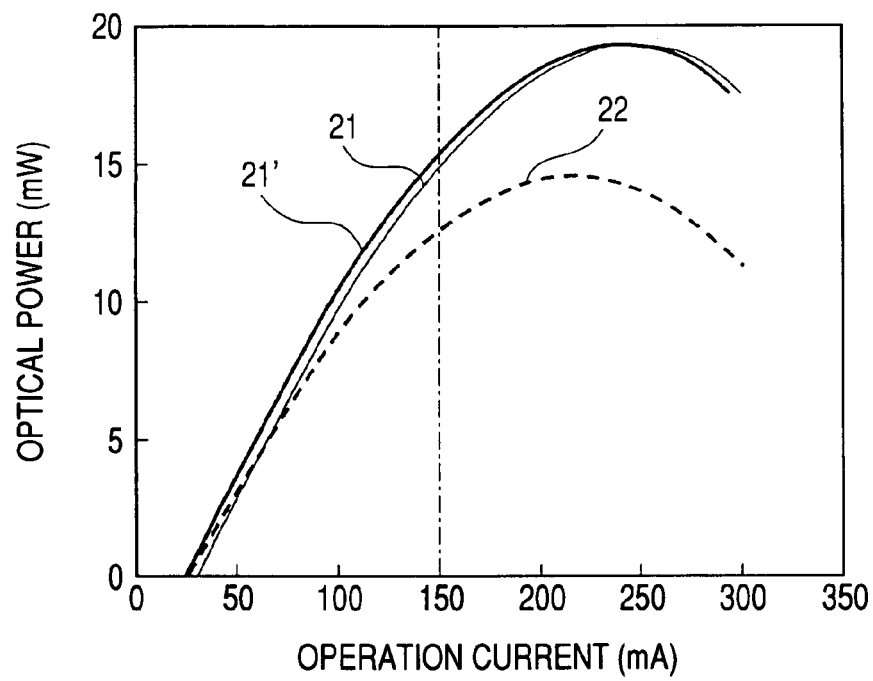
FIG. 7A is a graph to explain characteristics of the semiconductor laser diode of Embodiment 1.

FIG. 7A is not only a graph explaining the characteristic of the semiconductor laser diode of Embodiment 1 shown in FIG. 6 but also a graph showing comparison results of the operation characteristics of a semiconductor laser diode not having the upper buffer layer 6 and semiconductor laser diodes having the upper buffer layer 6 in which grooves reaching one half of the upper buffer layer 6 are present or absent, respectively. As in FIG. 3, the horizontal axis represents operating current, and the vertical axis represents optical power. The solid line 21' shows the characteristic of the semiconductor laser diode of Embodiment 1 at an operating temperature of 85 degree C., and the broken line 22 shows the characteristic of the semiconductor laser diode not provided with the upper buffer layer 6 at the same temperature, respectively. The thin solid line 21 shows the characteristic of the case shown in FIG. 3 where the grooves were not provided on the upper buffer layer 6. As is apparent from comparison of the solid line 21 and the broken line 22, their threshold currents are comparable, according to Embodiment 1, and an increase in threshold current caused by provision of the upper buffer layer could be suppressed. Further, as is apparent from comparison of the solid line 21' and the solid line 21, optical power could also be enhanced.

Figure 7B:
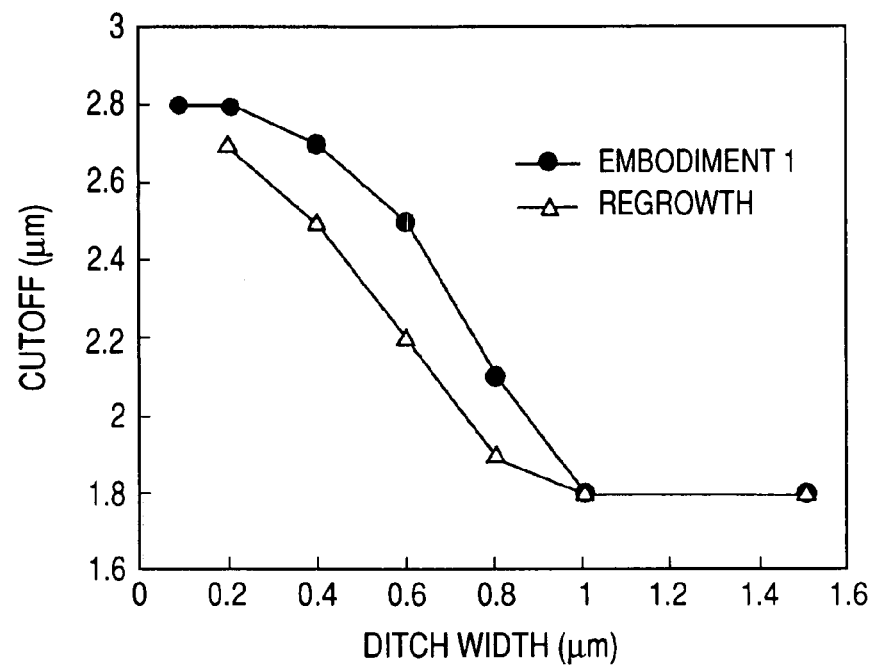
FIG. 7B is a characteristic graph showing evaluated relation of groove width in the upper buffer layer and cut-off width.

FIG. 7B is a characteristic graph showing evaluated relation of groove width in the upper buffer layer 6 and cut-off width, where the groove width is shown on the horizontal axis and the cut-off width is shown on the vertical axis. As mentioned earlier, a high power semiconductor laser diode can be realized by widening the ridge width. On the other hand, the widening of the ridge width becomes disadvantageous to the single mode condition. In the present invention, the upper buffer layer 6 was provided and the grooves to prevent current diffusion in the upper buffer layer 6 were provided as shown in Embodiment 1, thereby realizing effective widening of the ridge width. The result of evaluation of the relation between the groove width and the cut-off width under the condition satisfying the single mode is shown in FIG. 7B. Although a cut-off width (ridge width) of 2.8 µm could be realized at a groove width of 0.1 µm as described above, a cut-off width (ridge width) of 2.8 µm could be realized even at a groove width of 0.2 µm. However, it was found that when the groove width became 0.2 µm or wider, the cut-off width became smaller. In addition, a study result obtained when the insulating layer was formed by regrowth as disclosed in JP-A No. 214372/2004 mentioned above is also depicted. When InP, InGaAsP or InGaAlAs was regrown, due to an anisotropy of the crystal growth rate, the groove angle became 126 degrees or more. Thus, the groove width of 0.1 µm could not be formed and the single mode could not be satisfied at a large cut-off width as obtained in the present invention.

When the semiconductor laser diode of Embodiment 1 was operated in the range up to the operating current of 300 mA at from −5 degree C. to 85 degree C., the operation characteristic shown in FIG. 7A was obtained, and a lateral single mode was confirmed. In addition, it was found from the result in FIG. 7B that the groove width is desirable to be equal to or smaller than 0.8 µm in consideration of fabrication error and the like.

When the far field pattern was evaluated, expansion of the far field pattern in the semiconductor laser diode having the upper buffer layer 6 but not having the grooves formed along the side faces of the ridge 12 was 45 degrees in the perpendicular direction and 20 degrees in the horizontal direction with respect to the substrate 1. On the other hand, in the semiconductor laser diode of Embodiment 1, the expansion of the far field pattern was 45 degrees in the perpendicular direction and 25 degrees in the horizontal direction with respect to the substrate 1, and the anisotropy in the expansion was confirmed to be lessened.

Further, the semiconductor laser diode of Embodiment 1 exhibited excellent lasing characteristics with a threshold current of 10 to 20 mA and lasing efficiency of 0.3 to 0.4 W/A under the conditions of room temperature and continuous lasing. At an operating temperature of 85 degree C., a threshold current of ca. 20 to 30 mA and a lasing efficiency of 0.15 to 0.2 W/A were obtained. At a temperature of 85 degree C., a threshold current approximately equal to that for the semiconductor laser diode having no upper buffer layer, and an operating current of 150 mA, the optical power was increased by approximately 20% to 40%.

Although the lasing wavelength of laser, i.e. the emission wavelength of the multiple-quantum well active layer, was set to 1.5 µm in Embodiment 1, similar effects could also be obtained when the wavelength was set to 1.3 µm band or when a distributed Bragg reflection type or a Fabry-Perot type was used in place of the distributed feedback type. It is needless to say that similar effects were obtained as long as grooves having a similar angle could be formed even when the fabrication method of grooves differed. In addition, InGaAlAs series may be used in place of InGaAsP series. Although the silicon oxide film was used as the insulating film, it is also possible to use a silicon nitride film and the like.

In Embodiment 1, there are advantages that fabrication of a diffraction grating to select an appropriate lasing wavelength in accord with the wavelength corresponding to the absorption-edge energy of the optical modulator region becomes possible by fabricating the diffraction grating on the upper clad layer and that keeping constant the difference ($\Delta H$) between the wavelength of lasing light of the distributed feedback type semiconductor laser diode and the wavelength corresponding to the absorption-edge energy of the optical modulator region becomes possible.

Embodiment 2

Figure 8A:
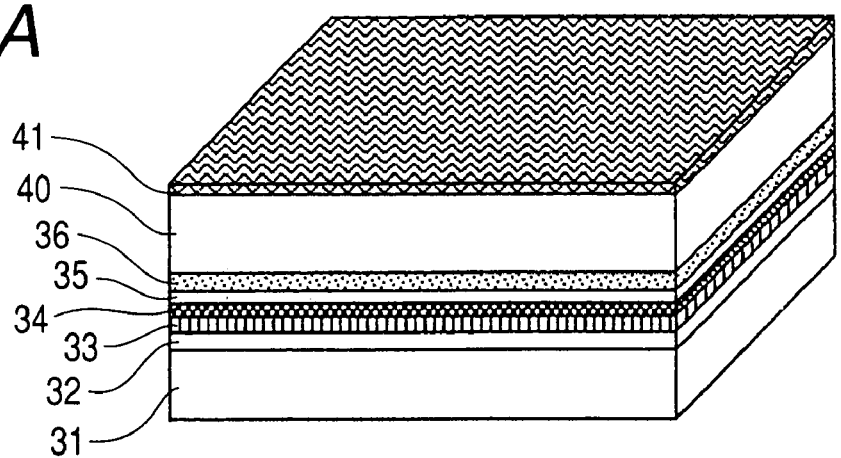
FIG. 8 is a diagram showing a fabrication process of a semiconductor laser diode of Embodiment 2 of the present invention realized by a structure starting with an n-type GaAs semiconductor substrate, where FIG. 8A, FIG. 8B.
FIG. 8C shows main successive steps of the process.
Figure 8B:
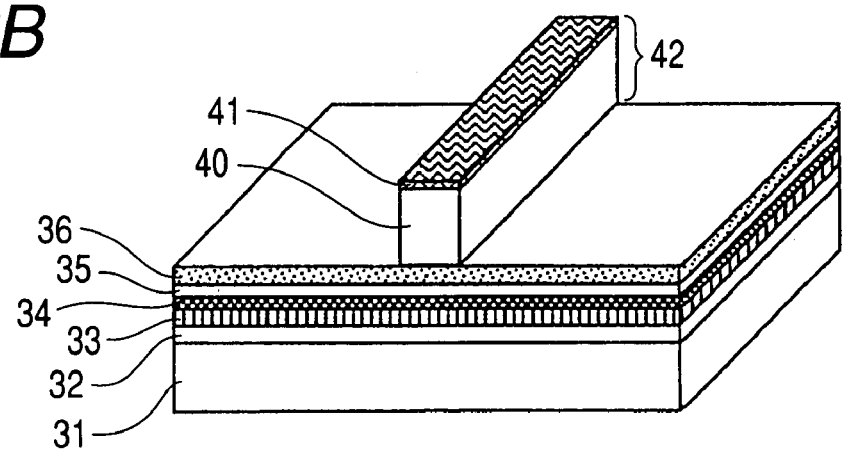
Figure 8C:
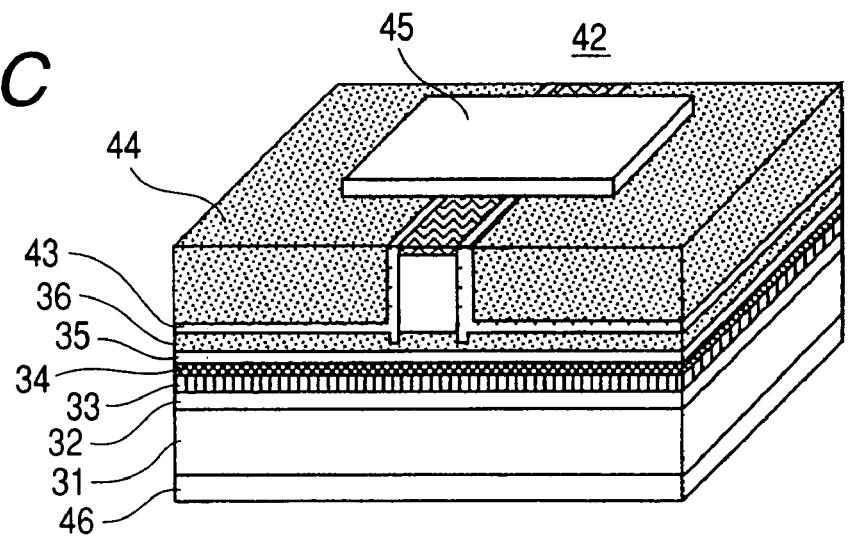

A semiconductor laser diode applied with the present invention can also be realized by a structure starting with an n-type GaAs semiconductor substrate in place of the structure starting with the n-type InP semiconductor substrate. FIGS. 8A to 8C are diagrams showing as Embodiment 2 the semiconductor laser diode realized by the structure starting with the n-type GaAs semiconductor substrate.

The semiconductor laser diode shown in Embodiment 2 is different in materials and part of the manufacturing process because the starting substrate is different but can be constructed by steps similar to those in Embodiment 1, and therefore explained in a simplified manner.

As shown in FIG. 8A, on an n-type GaAs semiconductor substrate 31 (thickness 2 mm), an n-type GaAs buffer layer 32 (film thickness 0.5 µm), a lower clad layer 33 (film thickness 2.5 µm) formed of n-type $(Al_xGa_{1-x})_{0.5}In_{0.5}P$ (x=0.60), a multiple-quantum well active layer 34 (thickness 0.024 µm) in which a well layer formed of GaInP (thickness 6 nm) having 1.1% compressive strain and a barrier layer (thickness 6 nm) formed of $(Al_xGa_{1-x})_{0.5}In_{0.5}P$ (x=0.45) having 0.7% tensile strain were laminated by 2 cycles, an upper clad layer 35. (film thickness 0.02 µm) formed of p-type $(Al_xGa_{1-x})_{0.5}In_{0.5}P$ (x=0.50), an upper buffer layer 36 (film thickness 0.3 µm) formed of $(Al_xGa_{1-x})_{0.5}In_{0.5}P$, a layer 40 (film thickness 2.0 µm) formed of $(Al_xGa_{1-x})_{0.5}In_{0.5}P$ (x=0.60), and a contact layer 41 (film thickness 0.2 µm) formed of GaAs were laminated by MOCVD. In this embodiment, the emission wavelength of the multiple-quantum well active layer was about 0.66 µm.

Then, in dry etching step, etching was performed until the surface of the upper buffer layer 36 was exposed as shown in FIG. 8B to form a ridge 42. The width of the ridge 42 was 1.7 µm.

After going through the steps similar to those in FIGS. 4A to 4D and FIGS. 5A to 5D, the semiconductor laser diode shown in FIG. 8C could be realized by the process starting with the n-type GaAs semiconductor substrate. Here, the reference numeral 43 denotes a silicon oxide film and represents an insulating layer corresponding to the silicon oxide film 23 in Embodiment 1. The reference numeral 44 represents a polyimide resin, which was provided on the upper face of the silicon oxide film 43 to flatten the wafer surface. This corresponds to the polyimide resin 24 in Embodiment 1. The reference numerals 45 and 46 represent p- and n-electrodes, respectively, which correspond to the p- and n-electrodes 15 and 16 in Embodiment 1. The device was cut out by a cleavage step, and a reflection film having 92% reflectance and a low reflection film having 7% reflectance were coated on the rear end face and the front end face thereof, respectively. The semiconductor laser diode of Embodiment 2 serves as a Fabry-Perot type laser, and therefore it is not necessary to form a diffraction grating layer in the ridge 42.

When grooves are formed by etching along the ridge 42, it is possible to adjust the groove depth by controlling the etching time in Embodiment 2 as well. In Embodiment 2, grooves with a width of 0.1 µm and a depth of 0.1 µm were formed with respect to the film thickness of 0.3 µm of the upper buffer layer 36. The grooves having an approximately vertical angle could be formed.

When the semiconductor laser diode of Embodiment 2 was operated in the range up to the operating current of 450 mA at from −10 degree C. to 80 degree C., a lateral single mode was confirmed. Even when grooves were formed as described above, it was confirmed that ridge width could be widened. Further, the semiconductor laser diode of Embodiment 2 exhibited excellent lasing characteristics with a threshold current of 40 to 55 mA and lasing efficiency of 1.0 to 1.2 W/A under the conditions of room temperature and continuous lasing. At a threshold current approximately equal to that for the semiconductor laser diode having no upper buffer layer and an operating current of 400 mA, the optical power was increased by about 20% to 40%.

Although the lasing wavelength of the semiconductor laser diode, i.e. the emission wavelength of the multiple-quantum well active layer, was set to 0.66 μm in Embodiment 2, similar effects could be obtained even when set to other wavelengths. The semiconductor laser diode fabricated as described above can be applied to laser diode (LD) for digital versatile disc (DVD).

Embodiment 3

An example of the integrated semiconductor optical waveguide device to which the present invention was applied is explained in Embodiment 3 with reference to FIGS. 9A to 9E, FIGS. 10A to 10E, and FIG. 11. It should be noted that the figure is used strictly for the purpose of explaining the present embodiment and the figure size and the scale described in the present embodiment do not necessarily correspond proportionately.

Figure 9A:
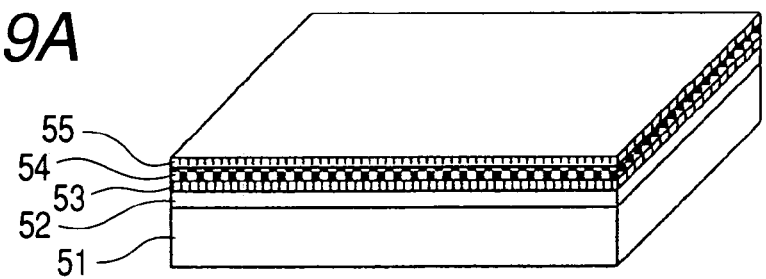
FIG. 9A, FIG. 9B, FIG. 9C, FIG. 9D, and FIG. 9E show successive steps of the process.

As shown in FIG. 9A, on an n-type InP semiconductor substrate 51 (thickness 2 mm), an n-type InP buffer layer 52 (film thickness 0.5 μm), a lower clad layer of electroabsorption type optical modulator 53 (film thickness 0.1 μm) formed of n-type InGaAlAs (compositional wavelength 0.92 μm), a multiple-quantum well active layer 54 in which a well layer (film thickness 7 nm, compositional wavelength 1.5 μm) formed of InGaAlAs having 0.6% compressive strain and a barrier layer (film thickness 10 nm, compositional wavelength 1.35 μm) formed of InGaAlAs having 0.6% tensile strain were laminated by 9 cycles, and an upper clad layer of electroabsorption type optical modulator 55 (film thickness 0.1 μm) formed of InGaAlAs (compositional wavelength 0.92 μm) were laminated.

Figure 9B:
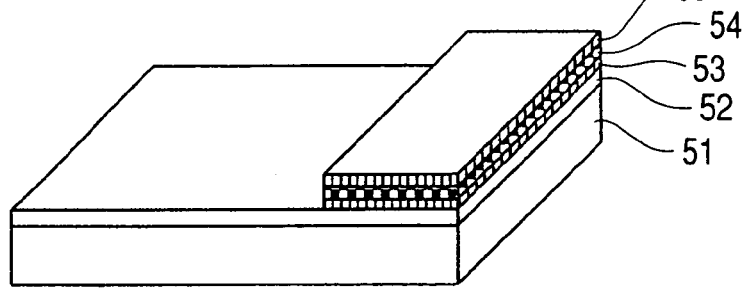

As shown in FIG. 9B, etching was performed up to the surface of the n-type InP buffer layer 52 leaving the width (for example, 300 μm) corresponding to an electroabsorption type optical modulator.

Figure 9C:
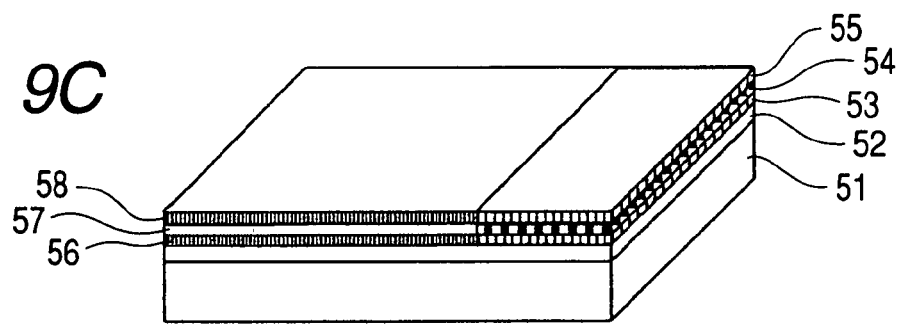

As shown in FIG. 9C, a waveguide lower clad layer 56 (film thickness 0.1 μm) formed of n-type InGaAsP (compositional wavelength 1.10 μm), a waveguide core 57 (film thickness 0.16 μm) formed of InGaAsP (compositional wavelength 1.3 μm), and a waveguide upper clad layer 58 (film thickness 0.1 μm) formed of InGaAsP (compositional wavelength 1.15 μm) were laminated.

Figure 9D:
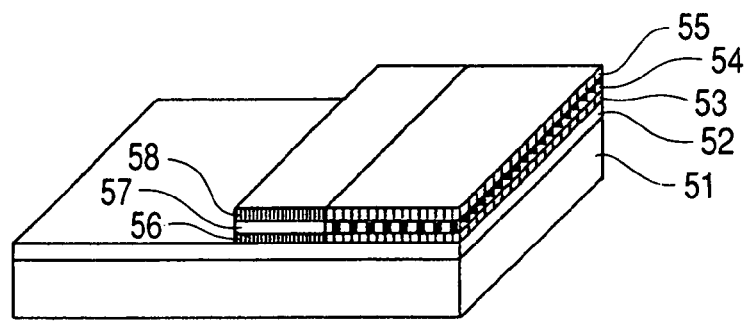

As shown in FIG. 9D, etching was performed up to the surface of the n-type InP buffer layer 52 leaving the electroabsorption type optical modulator in a length of 300 μm and a waveguide in a length of 150 μm.

Figure 9E:
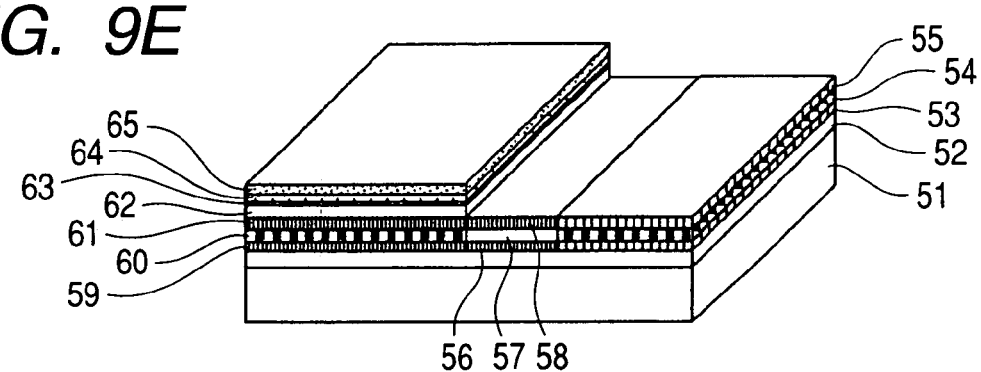

As shown in FIG. 9E, a lower clad layer, 59 (thickness 0.13 μm) formed of n-type InGaAsP (compositional wavelength 1.10 μm), a multiple-quantum well active layer 60 in which a well layer formed of InGaAsP (film thickness 7 nm, compositional wavelength 1.5 μm) having 1.0% compressive strain and a barrier layer formed of InGaAsP (film thickness 12 nm, compositional wavelength 1.3 μm) having 0.5% tensile strain were laminated by 5 cycles, an upper clad layer 61 (film thickness 0.10 μm) formed of InGaAsP (compositional wavelength 1.10 μm), an upper buffer layer 62 (film thickness 0.2 μm) formed of p-type InP, an etching stop layer 63 (film thickness 0.005 μm) formed of InGaAsP (compositional wavelength 1.3 μm), a lower spacer layer 64 (film thickness 0.02 μm) formed of p-type InP, and a diffraction grating layer 65 (film thickness 0.03 μm) formed of InGaAsP (compositional wavelength 1.3 μm) were laminated. The emission wavelength of the multiple-quantum well active layer was about 1.5 μm.

Figure 10A:
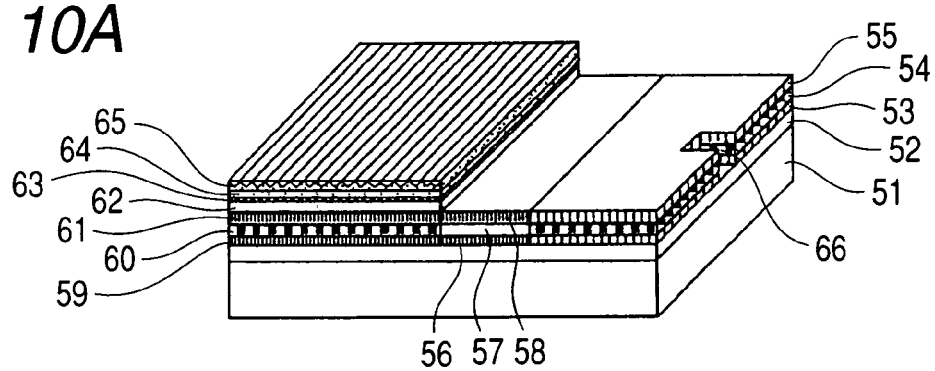
FIG. 10A, FIG. 10B, FIG. 10C, and FIG. 10D show successive steps of the process.

As shown in FIG. 10A, a diffraction grating was formed on the diffraction grating layer 65 by a known interference exposure method and subsequent etching using a phosphoric acid based solution. Further, a window 66 was formed on the electroabsorption type optical modulator. This diffraction grating serves as a floating type diffraction grating because the lower spacer layer 64 formed of InP is provided between the etching stop layer 63 and the diffraction grating layer 65. Accordingly, the diffraction grating could be accurately fabricated even when etching time varied somewhat.

Figure 10B:
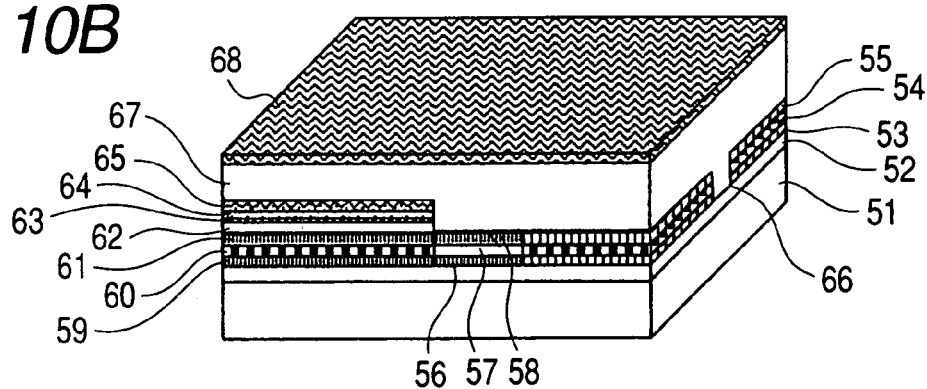

Subsequently, as shown in FIG. 10B, a p-type InP layer 67 (film thickness 2.0 μm) and a contact layer 68 (film thickness 0.3 μm) formed of InGaAsP (compositional wavelength 1.3 μm) and InGaAs were laminated, by MOCVD, on the diffraction grating layer 65 with a diffraction grating formed, the upper clad layer 58, and the n-type InP buffer layer 52 with the window 66 formed. Since the p-type InP layer 67 with the film thickness of 2.0 μm was exceptionally thicker compared to other layers, the laminated surface was practically flattened.

Figure 10C:
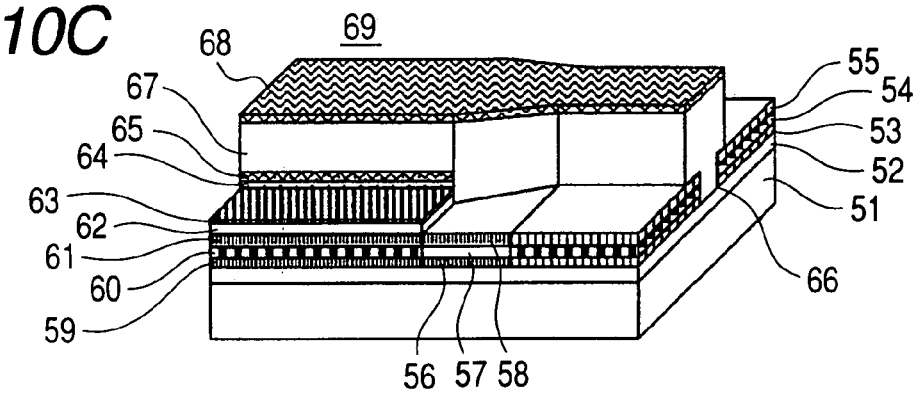

As shown in FIG. 10C, etching was performed up to the upper clad layer of the electroabsorption type optical modulator 55, the waveguide upper clad layer 58, and the etching stop layer 63 of the laser diode to form a ridge 69. At this time, the ridge width of the laser diode was 2.5 μm, and the ridge width of the electroabsorption type optical modulator was 1.5 μm. The ridge width of the waveguide that connects the laser diode portion to the electroabsorption type optical modulator portion was tapered so as to continuously change from the former toward the latter.

Figure 10D:
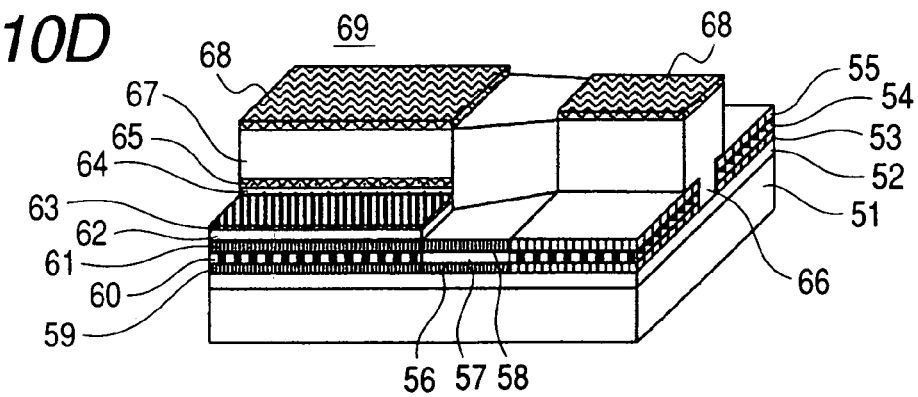

As shown in FIG. 10D, the contact layer 68 of the waveguide was removed to separate the contact layer of the laser diode and that of the electroabsorption type optical modulator.

Figure 11:
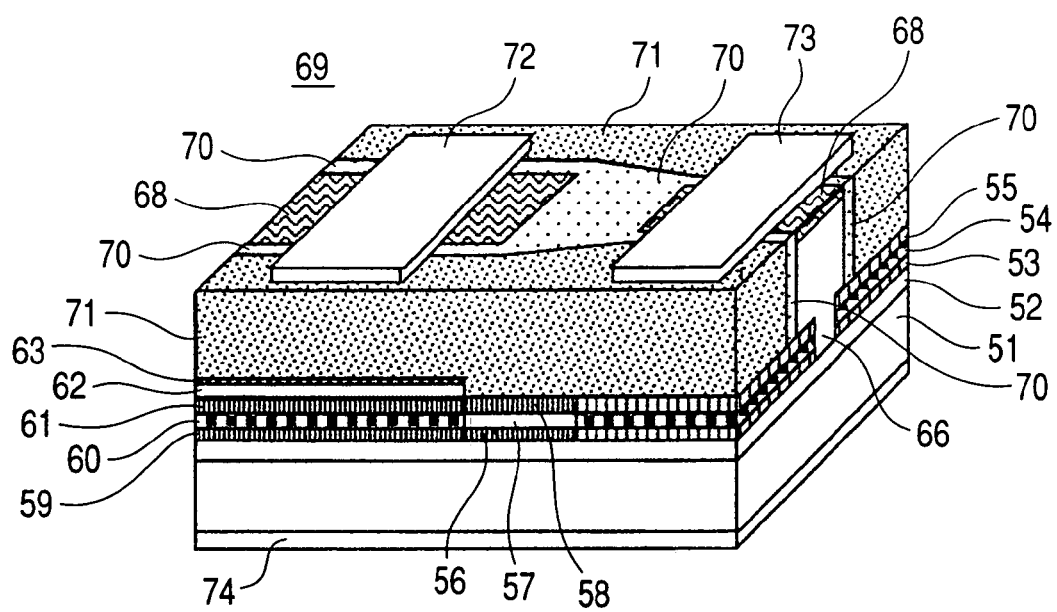
FIG. 11 represents a completed state of the integrated optical waveguide device of Embodiment 3 of the present invention.

FIG. 11 is a diagram showing the completed state of the integrated optical waveguide device of Embodiment 3. This could be obtained by implementing the following steps after the structure shown in FIG. 10D. As explained in FIG. 5C, a silicon dioxide film 70 (thickness 0.1 μm) was formed, by T-CVD, on the entire surfaces upper than the upper clad layer of the electroabsorption type optical modulator 55, the waveguide upper clad layer 58, and the etching stop layer 63 of the laser diode. Then, as explained in FIG. 5C, the insulating film on the contact layer 68 in the upper portion of the ridge 69 of the semiconductor laser diode and the electroabsorption type optical modulator was removed (at this time, the silicon dioxide film 70 remained on the upper portion of the waveguide). Although, in Embodiment 3, the silicon dioxide film was used as the insulating film, it is also possible to use silicon nitride film and the like. Next, as explained in FIG. 6, the wafer surface was flattened with a polyimide resin 71. Finally, a p-electrode 72 was formed on the contact layer 68 of the semiconductor laser diode, a p-electrode 73 was formed on the contact layer 68 of the electroabsorption type optical modulator, and an n-electrode 74 was formed on the backside of the n-type InP substrate 51. Then, the device was cut out by a cleavage step, and a reflection film having 95% reflectance and a low reflection film having 0.1% reflectance were coated on the rear end face and the front end face thereof, respectively.

In Embodiment 3, since the diffraction grating 65 is formed over the etching stop layer 63 in contrast to forming the diffraction grating in the upper clad layer 61 or the upper buffer layer 62, integration is possible by four growth steps. It should be noted that the growth order of the electroabsorption type optical modulator, the waveguide, and the semiconductor laser diode is not limited to this. Further, as the material for the semiconductor laser diode, InGaAlAs series can be employed in place of InGaAsP series as explained in Embodiment 2. Furthermore, as the material for the electroabsorption type optical modulator, InGaAsP series may be used in place of InGaAlAs series.

In Embodiment 3, the ridge width in the region of the semiconductor laser diode was 2.0 μm, and the ridge width in the region of the electroabsorption type optical modulator was 1.4 μm. The waveguide connecting the both regions was 150 μm in length and tapered. As the result, the ridge of the semiconductor laser diode and the ridge of the electroabsorption type optical modulator could be coupled with little optical loss.

Figure 12:
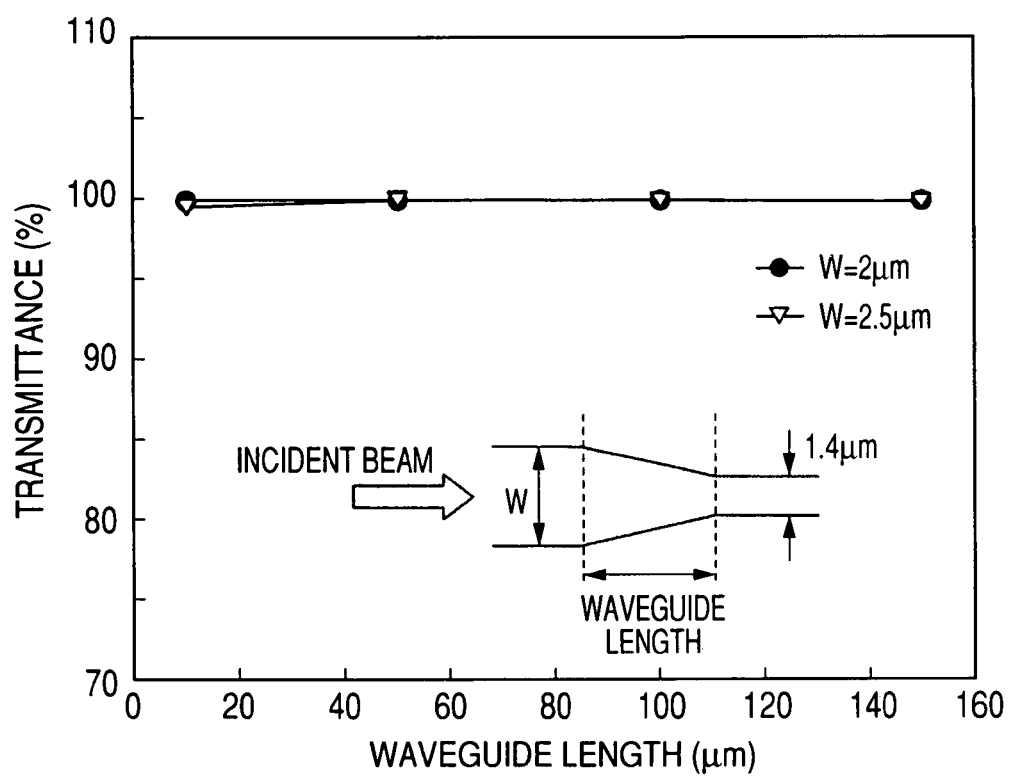
FIG. 12 is a graph showing evaluation results of characteristics of the integrated optical waveguide device of Embodiment 3 of the present invention when the ridge widths of semiconductor laser diodes were 2.0 µm and 2.5 µm, respectively, and the ridge width of an electroabsorption type optical modulator was 1.4 µm, where the waveguide length was taken on the horizontal axis and the transmittance was taken on the vertical axis.

FIG. 12 is a graph showing evaluation results of characteristics when the ridge widths of the semiconductor laser diode were 2.0 μm and 2.5 μm, respectively, and the ridge width of the electroabsorption type optical modulator was 1.4 μm, where the waveguide length was taken on the horizontal axis and the transmittance was taken on the vertical axis. As is evident from the figure, practically the same characteristics were obtained in the range of the waveguide length of 10 μm to 150 μm. Therefore, as long as both are coupled with an appropriate difference in width and length, the tapering inclination has little influence on the coupling. Further, provision of the window 66 facilitates optical coupling to optical fiber, thereby enabling coupling loss to be suppressed to 3 dB or lower.

Further, when the far field pattern of the integrated semiconductor optical waveguide device of Embodiment 3 was measured, the expansion was 45 degrees in the perpendicular direction and 35 degrees in the horizontal direction with respect to the substrate in the integrated semiconductor optical waveguide device described in Embodiment 3, whereas the expansion was 45 degrees in the perpendicular direction and 20 degrees in the horizontal direction in the semiconductor laser diode alone. Thus it was confirmed that anisotropy in expansion was lessened in the former. The operating current of the semiconductor laser diode was in the range of 70 to 150 mA when operated at from −5 degree C. to 85 degree C. By controlling the offset bias optimally and making modulation amplitude voltage equal to or lower than 2.5 V at from −5 degree C. to 85 degree C. with respect to the voltage applied to the p-electrode 73 of the electroabsorption type optical modulator, an optical power equal to or higher than 1 dB, a dynamic quenching ratio equal to or higher than 10 dB, and a band equal to or higher than 10 Gbps could be obtained. Owing to this, it became possible to obtain a good eye pattern at a bit rate of 10 Gbps and a transmission distance of 40 km or more without a need for temperature control between −5 degree C. and 85 degree C.

Although the semiconductor laser diode of the integrated semiconductor optical waveguide device of Embodiment 3 had the same structure as that of the semiconductor laser diode as the premise of the present invention that was explained in FIGS. 1 and 2, it may be structured so as to have grooves shown in FIG. 6 explained in Embodiment 1.

Figure 13:
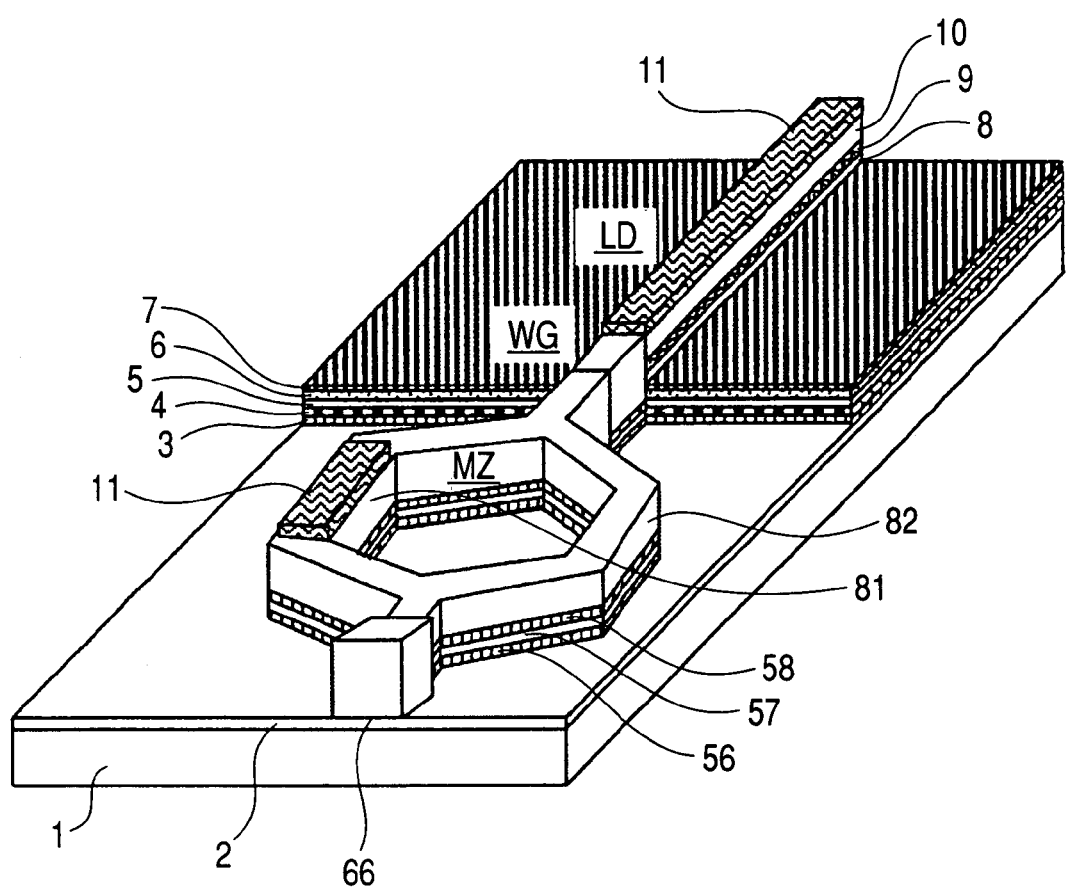
FIG. 13 is a diagram representing a completed state of an integrated optical waveguide device of Embodiment 4, where a Mach-Zehnder type optical modulator was employed in place of the electroabsorption type optical modulator in the integrated optical waveguide device of the present invention.

Embodiment 4—Fabrication Method of Mach-Zehnder (MZ) Version of Integrated Device As Embodiment 4 of the integrated semiconductor optical waveguide device applied with the present invention, an example of the integrated semiconductor optical waveguide device in which a Mach-Zehnder type optical modulator was employed in place of the electroabsorption type optical modulator is explained using FIG. 13. It should be noted that the figure is used only to explain the present embodiment and the figure size and the scale described in the present embodiment do not necessarily correspond proportionately.

FIG. 13 is a diagram showing the structure of the integrated optical waveguide device of Embodiment 4. In the optical waveguide device of Embodiment 4, a semiconductor laser diode LD, a waveguide WG, a Mach-Zehnder type optical modulator MZ, and a window 66 were formed on an n-type InP substrate 1 and InP buffer layer 2 and were in cascade connection. The semiconductor laser diode LD had the same structure as that of the semiconductor laser diode as the premise of the present invention that was explained with reference to FIGS. 1 and 2, and the same reference numerals were attached. Although the waveguide WG was the same as that in the structure of the integrated semiconductor optical waveguide device of Embodiment 2 that was explained with reference to FIGS. 9 to 11, the reference numerals were omitted because the illustration becomes complicated. The Mach-Zehnder type optical modulator MZ was not only connected to the waveguide WG but also split into two optical paths 81 and 82, which were again joined together to be connected to the window 66. On one optical path 81 of the two optical paths 81 and 82, the contact layer 11 was formed. As in the case of the waveguide WG, the waveguide lower clad layer 56, the waveguide core 57 formed of InGaAsP (compositional wavelength 1.3 μm), and the waveguide upper clad layer 58 formed of InGaAsP (compositional wavelength 1.15 μm) were also laminated for the two optical paths 81 and 82.

To describe the fabrication process briefly, first, semiconductor laser diode LD was laminated in a manner similar to that shown in FIG. 1C, and then etching of the regions for the waveguide WG and the Mach-Zehnder type optical modulator MZ was performed up to the surface of the InP buffer layer 2, followed by laminating the above waveguide parts 56 to 58 thereon. After forming the window 66, a p-type InP layer and the contact layer 11 were laminated. This state was similar to that shown in FIG. 10B. Then, in a manner similar to that shown in FIGS. 10C and 10D, the structure shown in FIG. 13 was obtained. Finally, in a manner similar to that shown in FIG. 11, the integrated semiconductor optical waveguide device of Embodiment 4 was completed, though the illustration thereof was omitted.

Here, optical path lengths of the two optical paths 81 and 82 are made to differ from each other by one half of the wavelength of oscillation frequency of the semiconductor laser diode LD. When the voltage applied between the electrode connected to the contact layer 11 of the optical path 81 and the electrode provided on the backside of the substrate 1 becomes a predetermined value, the respective optical path lengths of the optical paths 81 and 82 are, for example, made to become equal by the change in the refractive index of the optical path 81 and the resulting change in transmitted optical path length. As the result, when there is no voltage between those electrodes, no optical signal is output, and when the voltage is applied between the electrodes, an optical signal is output.

In Embodiment 4 as well, the ridge of the waveguide WG was tapered, for example with the ridge width of the semiconductor laser diode LD being 2.0 μm and the ridge width of the Mach-Zehnder type optical modulator MZ being 1.0 μm, such that both might be coupled with little optical loss. Further, optical coupling to optical fiber was facilitated by the window 66, and coupling loss could be suppressed to 3 dB or lower. The operating current of the semiconductor laser diode LD was in the range of 70 to 150 mA when operated at from −5 degree C. to 85 degree C. By controlling the offset bias optimally and making modulation amplitude voltage equal to or lower than 2.5 V at from −5 degree C. to 85 degree C. with respect to the voltage applied to the electrode 11 of the Mach-Zehnder type optical modulator, an optical power equal to or higher than 3 dB, a dynamic quenching ratio equal to or higher than 10 dB, and a band equal to or higher than 10 Gbps could be obtained. Owing to this, it became possible to obtain a good eye pattern at a bit rate of 10 Gbps and a transmission distance of 40 km or more without a need for temperature control between −5 degree C. and 85 degree C.

It should be noted that the Mach-Zehnder type optical modulator MZ is not limited to this but may be replaced by an optical waveguide device provided with functions comparable to this. Further, integration with an optical amplifier in addition to an optical modulator is also possible.

What is claimed is:

1. A semiconductor laser diode having a semiconductor substrate, a lower clad layer provided on the substrate, an active layer provided on the lower clad layer, an upper clad layer provided on the active layer, and a ridge provided on the upper clad layer, the semiconductor laser diode comprising:

an upper buffer layer formed between the upper clad layer and the ridge, and grooves formed along both sides of the ridge into the buffer layer, wherein the width of the grooves is from more than 0 to 200 nm and the angle of the side face of the groove with respect to the substrate surface is 90 degrees ±10 degrees at the central part of the depth.

2. The semiconductor laser diode according to claim 1, wherein the grooves are formed through the entire thickness or part of the thickness of the upper buffer layer.

3. The semiconductor laser diode according to claim 1, wherein the semiconductor substrate is formed of n-type InP, the lower clad layer is formed of n-type InGaAsP, the active layer is formed of InGaAsP, and the upper clad layer is formed of InGaAsP.

4. The semiconductor laser diode according to claim 1, wherein the semiconductor substrate is formed of n-type InP, the lower clad layer is formed of n-type InGaAlAs, the active layer is formed of InGaAlAs, and the upper clad layer is formed of InGaAlAs.

5. The semiconductor laser diode according to claim 1, wherein the semiconductor substrate is formed of n-type GaAs, the lower clad layer is formed of n-type AlGaInP, the active layer is formed of AlGaInP and GaInP, and the upper clad layer is formed of p-type AlGaInP.

* * * * *